(12) United States Patent  
Challa et al.

(10) Patent No.: US 8,576,955 B2
(45) Date of Patent: Nov. 5, 2013

(54) ARCHITECTURE TO HANDLE CONCURRENT MULTIPLE CHANNELS

(75) Inventors: Raghu N. Challa, San Diego, CA (US); Hemanth Sampath, San Diego, CA (US); Ali RostamPisheh, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 708 days.

(21) Appl. No.: 12/413,069

(22) Filed: Mar. 27, 2009

(65) Prior Publication Data

US 2009/0245435 A1 Oct. 1, 2009

Related U.S. Application Data

(60) Provisional application No. 61/040,540, filed on Mar. 28, 2008.

(51) Int. Cl.
*H04L 27/06* (2006.01)
(52) U.S. Cl.
USPC .......................................................... 375/340
(58) Field of Classification Search
USPC ........................................ 375/262, 340–341
See application file for complete search history.

(56) References Cited

U.S. PATENT DOCUMENTS

| | | | |
|---|---|---|---|
| 6,947,501 B2 | 9/2005 | Kawai et al. | |
| 6,986,096 B2 | 1/2006 | Chaudhuri et al. | |
| 7,149,951 B2 * | 12/2006 | Seo | 714/786 |
| 7,584,407 B2 * | 9/2009 | Kim | 714/794 |
| 7,594,160 B2 * | 9/2009 | Cho et al. | 714/780 |
| 7,779,338 B2 | 8/2010 | Altintas et al. | |
| 2001/0047268 A1 | 11/2001 | Kawai et al. | |
| 2002/0174401 A1 * | 11/2002 | Wang et al. | 714/786 |
| 2003/0018942 A1 * | 1/2003 | Seo | 714/786 |
| 2004/0042565 A1 * | 3/2004 | Garrett | 375/341 |
| 2005/0181735 A1 | 8/2005 | Hiraki et al. | |

(Continued)

FOREIGN PATENT DOCUMENTS

| | | |
|---|---|---|
| CN | 1968274 A | 5/2007 |
| JP | 2001339448 A | 12/2001 |

(Continued)

OTHER PUBLICATIONS

International Search Report and Written Opinion—PCT/US2009/038705, International Search Authority—European Patent Office—Feb. 18, 2010.

(Continued)

*Primary Examiner* — Jean B Corrielus
(74) *Attorney, Agent, or Firm* — Tyler J. Overall

(57) ABSTRACT

An apparatus and method for enhanced downlink processing of received channels in a mobile communications system is described, containing a buffer for control data and traffic data, a demapper engine with at least two independently operating demappers for demapping the control and traffic data, a log-likelihood-ratio (LLR) buffer for supporting memory segments accessible by the demapper engine, a decoder engine containing decoders, each of the decoders operating on data from selected memory segment(s) of the LLR buffer, and an arbitrator providing control of at least one of the demapper engine, LLR buffer, and decoder engine. At least one of the decoders is suited for decoding control data and another one of the decoders is suited for decoding traffic data. By partitioning the decoding as such, an increase in downlink throughput can be obtained.

47 Claims, 8 Drawing Sheets

(56) References Cited

U.S. PATENT DOCUMENTS

| | | |
|---|---|---|
| 2005/0190868 A1 | 9/2005 | Khandekar et al. |
| 2007/0002977 A1* | 1/2007 | Cho et al. ............... 375/340 |
| 2007/0011593 A1 | 1/2007 | Cho et al. |
| 2007/0019752 A1* | 1/2007 | Kim ...................... 375/260 |
| 2007/0067704 A1 | 3/2007 | Altintas et al. |
| 2008/0072115 A1* | 3/2008 | Cho et al. ............... 714/751 |
| 2008/0291724 A1* | 11/2008 | Litsyn et al. ............ 365/185.03 |
| 2009/0180571 A1* | 7/2009 | Song et al. .............. 375/295 |
| 2010/0067598 A1* | 3/2010 | Sampath et al. .......... 375/262 |

FOREIGN PATENT DOCUMENTS

| | | |
|---|---|---|
| JP | 2005522963 A | 7/2005 |
| JP | 2005237031 A | 9/2005 |
| JP | 2006311490 A | 11/2006 |
| JP | 200752591 A | 9/2007 |
| JP | 2008118628 A | 5/2008 |
| RU | 2350029 | 3/2009 |
| WO | WO9817050 A1 | 4/1998 |
| WO | WO03090011 A2 | 10/2003 |
| WO | WO2005027355 | 3/2005 |
| WO | WO2005060109 A2 | 6/2005 |
| WO | WO2006123908 A1 | 11/2006 |
| WO | WO2006126943 A1 | 11/2006 |
| WO | WO2007118132 A2 | 10/2007 |
| WO | WO2008014473 | 1/2008 |

OTHER PUBLICATIONS

Wei Han; Ying Yi; Muir M; Nousias I; Tughrul Arslan; Edorgan A T Ed—Anonymous: "Efficient Implementation of Wireless Applications on Multi-core Platforms Based on Dynamically Reconfigurable Processors" Complex, Intelligent and Software Intensive Systems, 2008. CISIS 2008. International.

Wei Han; Ying Yi; Muir M; Nousias I; Tughrul Arslan; Edogran A T Ed—Anonymous: "Efficient Implementation of Wireless Applications on Multi-core Platforms Based on Dynamically Reconfigurable Processors" Complex Intelligent and Software Intensive Systems, 2008. CISIS 2008. International Conference ON, IEEE, Piscataway, NJ, USA, Mar.4, 2008, pp. 837-842, XP031312245 ISBN: 9780769531090 Chapters 2 and 4.

Taiwan Search Report—TW098110495—TIPO—Apr.10, 2013.

* cited by examiner

PACKETS

ARCHITECTURE TO HANDLE CONCURRENT MULTIPLE CHANNELS

RELATED APPLICATIONS

The present application for patent claims priority to U.S. Provisional Application No. 61/040,540 entitled "Architecture to Handle Concurrent Multiple Channels", filed Mar. 28, 2008, which is hereby expressly incorporated by reference in its entirety.

BACKGROUND

1. Field

This invention is related to wireless communication systems. More particularly, this invention is related to systems and methods for providing improved throughput for downlink processing of information.

2. Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP LTE systems, and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out, multiple-in-signal-out or a multiple-in-multiple-out (MIMO) system.

A MIMO system employs multiple ($N_T$) transmit antennas and multiple ($N_R$) receive antennas for data transmission. A MIMO channel formed by the $N_T$ transmit and $N_R$ receive antennas may be decomposed into Ns independent channels, which are also referred to as spatial channels, where $N_S \leq \min\{N_T, N_R\}$. Each of the $N_S$ independent channels corresponds to a dimension. The MIMO system can provide improved performance (e.g., higher throughput and/or greater reliability) if the additional dimensionalities created by the multiple transmit and receive antennas are utilized.

A MIMO system supports time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point to extract transmit beamforming gain on the forward link when multiple antennas are available at the access point.

SUMMARY

The present disclosure contains descriptions relating to coordinating multiple systems for increased downlink data processing.

In one of various aspects of the disclosure, an apparatus for enhanced downlink processing of received channels in a mobile communications system is provided, the apparatus comprising: a buffer capable of containing at least demodulated control data and demodulated traffic data; a demapper engine containing at least two demappers capable of independently operating on the at least control data and traffic data from the buffer; a log-likelihood-ratio (LLR) buffer capable of supporting a plurality of memory segments accessible by the demapper engine; a decoder engine containing a plurality of decoders, each of the plurality of decoders operating on data from a selected memory segment of the LLR buffer; and an arbitrator providing control of at least one of the demapper engine, LLR buffer, and decoder engine, wherein at least one of the plurality of decoders is suited for decoding control data and at least another one of the plurality of decoders is suited for decoding traffic data.

In another aspect of the disclosure, a method for enhanced downlink processing of received channels in a mobile communications system is provided, the method comprising: inputting into a buffer demodulated control data and demodulated traffic data; demapping the control data and traffic data from the buffer using at least two demappers capable of independent operation; loading demapped data into a log-likelihood-ratio (LLR) buffer capable of supporting a plurality of memory segments; decoding data in the LLR buffer using a plurality of decoders, each of the plurality of decoders operating on data from a selected memory segment of the LLR buffer; and controlling operation of at least one of the demapping, accessing the LLR buffer, and decoding, wherein at least one of the plurality of decoders is suited for decoding control data and at least another one of the plurality of decoders is suited for decoding traffic data.

In another aspect of the disclosure, an apparatus for enhanced downlink processing of received channels in a mobile communications system is provided, the apparatus comprising: means for storing at least demodulated control data and demodulated traffic data; a plurality of means for independently demapping control data and traffic data from the means for containing; means for log-likelihood-ratio (LLR) storing, being capable of supporting a plurality of memory segments accessible by the plurality of means for independently demapping; a plurality of means for decoding, operating on data from a selected memory segment of the means for LLR storing; and means for providing control of at least one of the plurality of means for demapping, means for LLR storing, and plurality of means for decoding, wherein at least one of the plurality of means for decoding is suited for decoding control data and at least another one of the plurality of means for decoding is suited for decoding traffic data.

In another aspect of the disclosure, a computer program product is provided, comprising: a computer-readable medium comprising: code for inputting into a buffer demodulated control data and demodulated traffic data; code for demapping the control data and traffic data from the buffer using at least two demappers capable of independent operation; code for loading demapped data into a log-likelihood-ratio (LLR) buffer capable of supporting a plurality of memory segments; code for decoding data in the LLR buffer using a plurality of decoders, each of the plurality of decoders operating on data from a selected memory segment of the LLR buffer; and code for controlling operation of at least one of the demapping, accessing the LLR buffer, and decoding, wherein at least one of the plurality of decoders is suited for decoding control data and at least another one of the plurality of decoders is suited for decoding traffic data.

In another aspect of the disclosure, an apparatus for enhanced downlink processing of received channels in a mobile communications system is provided, the apparatus comprising: a processor, configured to control operations for: inputting into a buffer demodulated control data and demodulated traffic data; demapping the control data and traffic data from the buffer using at least two demappers capable of independent operation; loading demapped data into a log-likelihood-ratio (LLR) buffer capable of supporting a plurality of memory segments; decoding data in the LLR buffer using a plurality of decoders, each of the plurality of decoders operating on data from a selected memory segment of the LLR buffer; and controlling operation of at least one of the demapping, accessing the LLR buffer, and decoding, wherein at least one of the plurality of decoders is suited for decoding control data and at least another one of the plurality of decoders is suited for decoding traffic data; and a memory coupled to the processor for storing data.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
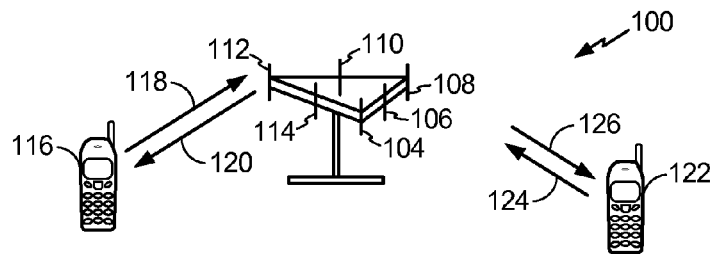
FIG. 1 illustrates a multiple access wireless communication system according to one embodiment.

For the purposes of the present document, the following abbreviations apply, unless otherwise noted:
AM Acknowledged Mode
AMD Acknowledged Mode Data
ARQ Automatic Repeat Request
BCCH Broadcast Control CHannel
BCH Broadcast CHannel
C- Control-
CCCH Common Control CHannel
CCH Control CHannel
CCTrCH Coded Composite Transport Channel
CP Cyclic Prefix
CRC Cyclic Redundancy Check
CTCH Common Traffic CHannel
DCCH Dedicated Control CHannel
DCH Dedicated CHannel
DL DownLink
DSCH Downlink Shared CHannel
DTCH Dedicated Traffic CHannel
ECI Extended Channel Information
FACH Forward link Access CHannel
FDD Frequency Division Duplex
L1 Layer 1 (physical layer)
L2 Layer 2 (data link layer)
L3 Layer 3 (network layer)
LI Length Indicator
LSB Least Significant Bit
MAC Medium Access Control
MBMS Multimedia Broadcast Multicast Service
MCCH MBMS point-to-multipoint Control CHannel
MRW Move Receiving Window
MSB Most Significant Bit
MSCH MBMS point-to-multipoint Scheduling CHannel
MTCH MBMS point-to-multipoint Traffic CHannel
PBCCH Primary Broadcast Control CHannel
PCCH Paging Control CHannel
PCH Paging CHannel
PDU Protocol Data Unit
PHY PHYsical layer
PhyCH Physical CHannels
QPCH Quick Paging CHannel
RACH Random Access CHannel
RLC Radio Link Control
RRC Radio Resource Control
SAP Service Access Point
SBCCH Secondary Broadcast Control CH
SDU Service Data Unit
SHCCH SHared channel Control CHannel
SN Sequence Number
SSCH Shared Signaling CHannel
SUFI SUper FIeld
TCH Traffic CHannel
TDD Time Division Duplex
TFI Transport Format Indicator
TM Transparent Mode
TMD Transparent Mode Data
TTI Transmission Time Interval
U- User-
UE User Equipment
UL UpLink
UM Unacknowledged Mode
UMD Unacknowledged Mode Data
UMTS Universal Mobile Telecommunications System
UTRA UMTS Terrestrial Radio Access
UTRAN UMTS Terrestrial Radio Access Network
MBSFN Multicast Broadcast Single Frequency Network
MCE MBMS Coordinating Entity
MCH Multicast CHannel
DL-SCH Downlink Shared CHannel
MSCH MBMS Control CHannel
PDCCH Physical Downlink Control CHannel
PDSCH Physical Downlink Shared CHannel The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

Single carrier frequency division multiple access (SC-FDMA), which utilizes single carrier modulation and frequency domain equalization is a technique. SC-FDMA has similar performance and essentially the same overall complexity as those of an OFDMA system. SC-FDMA signal has lower peak-to-average power ratio (PAPR) because of its inherent single carrier structure. SC-FDMA has drawn great attention, especially in the uplink communications where lower PAPR greatly benefits the mobile terminal in terms of transmit power efficiency. It is currently a working assumption for uplink multiple access scheme in 3GPP Long Term Evolution (LTE), or Evolved UTRA.

Referring to FIG. 1, a multiple access wireless communication system according to one embodiment is illustrated. An access point 100 (AP) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over forward link 120 and receive information from access terminal 116 over reverse link 118. Access terminal 122 is in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequencies for communication. For example, forward link 120 may use a different frequency than that used by reverse link 118.

Each group of antennas and/or the area in which they are designed to communicate is often referred to as a sector of the access point. In the embodiment, antenna groups each are designed to communicate to access terminals in a sector, of the areas covered by access point 100.

In communication over forward links 120 and 126, the transmitting antennas of access point 100 utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, or some other terminology. An access terminal may also be called an user equipment (UE), a wireless communication device, terminal, access terminal or some other terminology.

Figure 2:
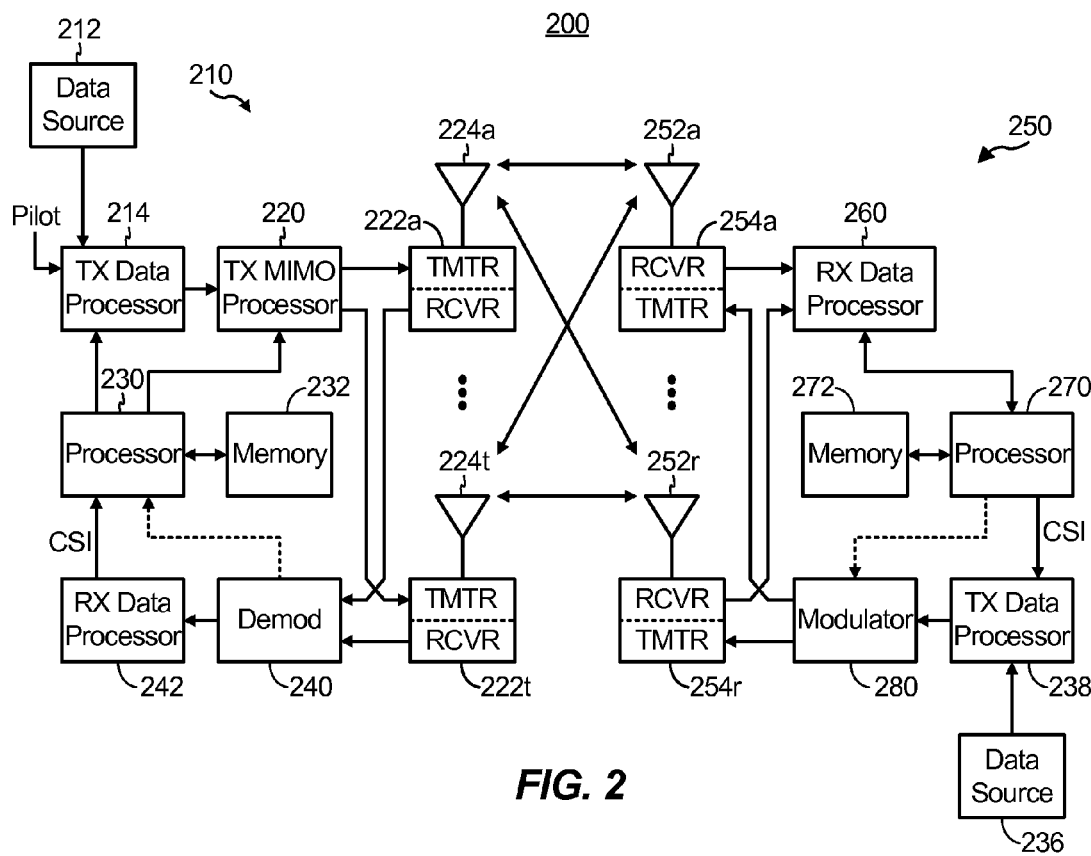
FIG. 2 is a block diagram of a communication system.

FIG. 2 is a block diagram of an embodiment of a transmitter system 210 (also known as the access point) and a receiver system 250 (also known as access terminal) in a MIMO system 200. At the transmitter system 210, traffic data for a number of data streams is provided from a data source 212 to transmit (TX) data processor 214.

In an embodiment, each data stream is transmitted over a respective transmit antenna or antenna group. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, M-QAM, or so forth) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain embodiments, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from the $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210.

A processor 270 periodically determines which pre-coding matrix to use (discussed below). Processor 270 formulates a reverse link message comprising a matrix index portion and a rank value portion.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reverse link message transmitted by the receiver system 250. Processor 230 then determines which pre-coding matrix to use for determining the beamforming weights, then processes the extracted message.

Figure 3:
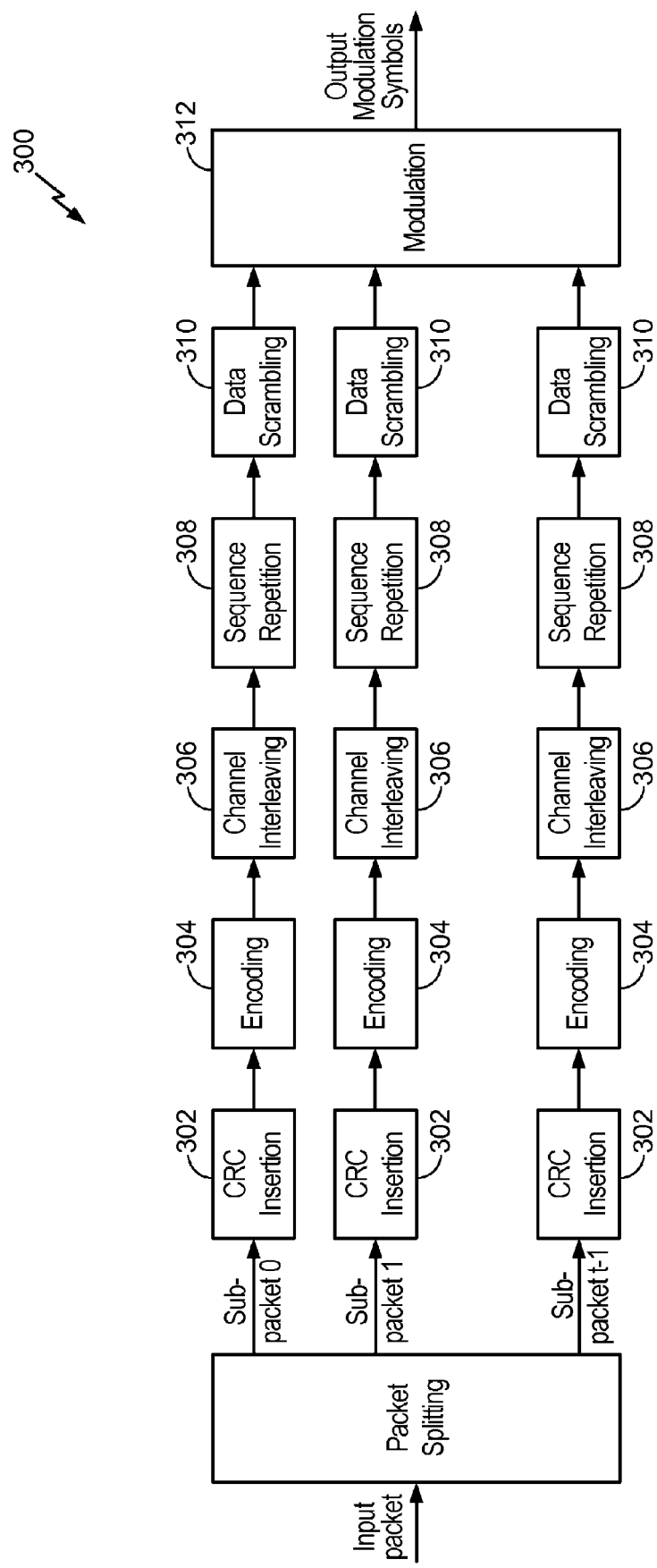
FIG. 3 is a block diagram of a transmission architecture for arranging packets of data.

FIG. 3 depicts and exemplary transmitting architecture 300. As suggested in FIG. 3, a packet of information can be split into a number of sub-packets {0, 1, 2, ... t−1} with each sub-packet receiving a CRC checksum 302, then undergoing a number of standard processes, such as encoding 304, interleaving 306, sequence repetition 308 and scrambling 310. The resultant processed sub-packets may then be combined into a larger architecture (described further below), then modulated 312 and transmitted according to an OFDM scheme, and according to a temporal architecture of frames and super-frames, such as that shown in FIG. 4.

Figure 4:
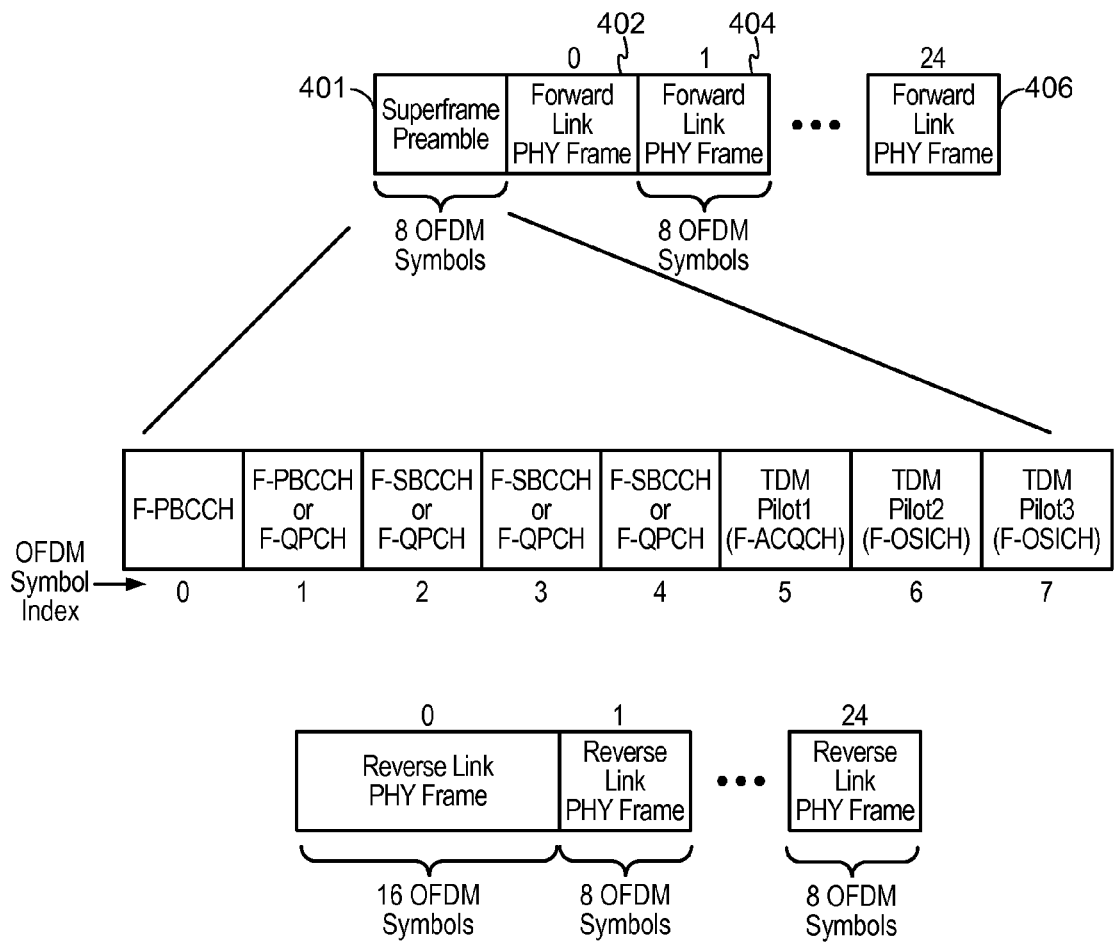
FIG. 4 is an exemplary frame/super-frame transmission architecture.

FIG. 4 depicts a frame arrangement suitable for OFDM showing packet/sub-packet sequencing for the forward and reverse link. The sequencing at the upper part of FIG. 4 shows a series of sub-packets 402, 404, and 406 appended to the forward link Superframe Preamble 401. For various blocks of data in a frame/super-frame architecture, OFDM signals and data may be organized into sub-blocks, called "tiles" for the purposes of this disclosure. Each of the sub-packets will have an OFDM-to-Tone tile structure similar to that shown in FIG. 5—with one or more tiles being associated to different users in the sector and/or network. Sub-packets containing traffic data will be embedded with Control data which is used to determine where in the sub-packet the traffic data is located as well as how much traffic data is there is in the sub-packet, and other relevant information. Because the traffic data can be placed at different locations in the tiles, it is necessary to first process the Control data before attempting to process the traffic data. Exemplary approaches to improving throughput in view of this requirement are discussed below.

Figure 5:
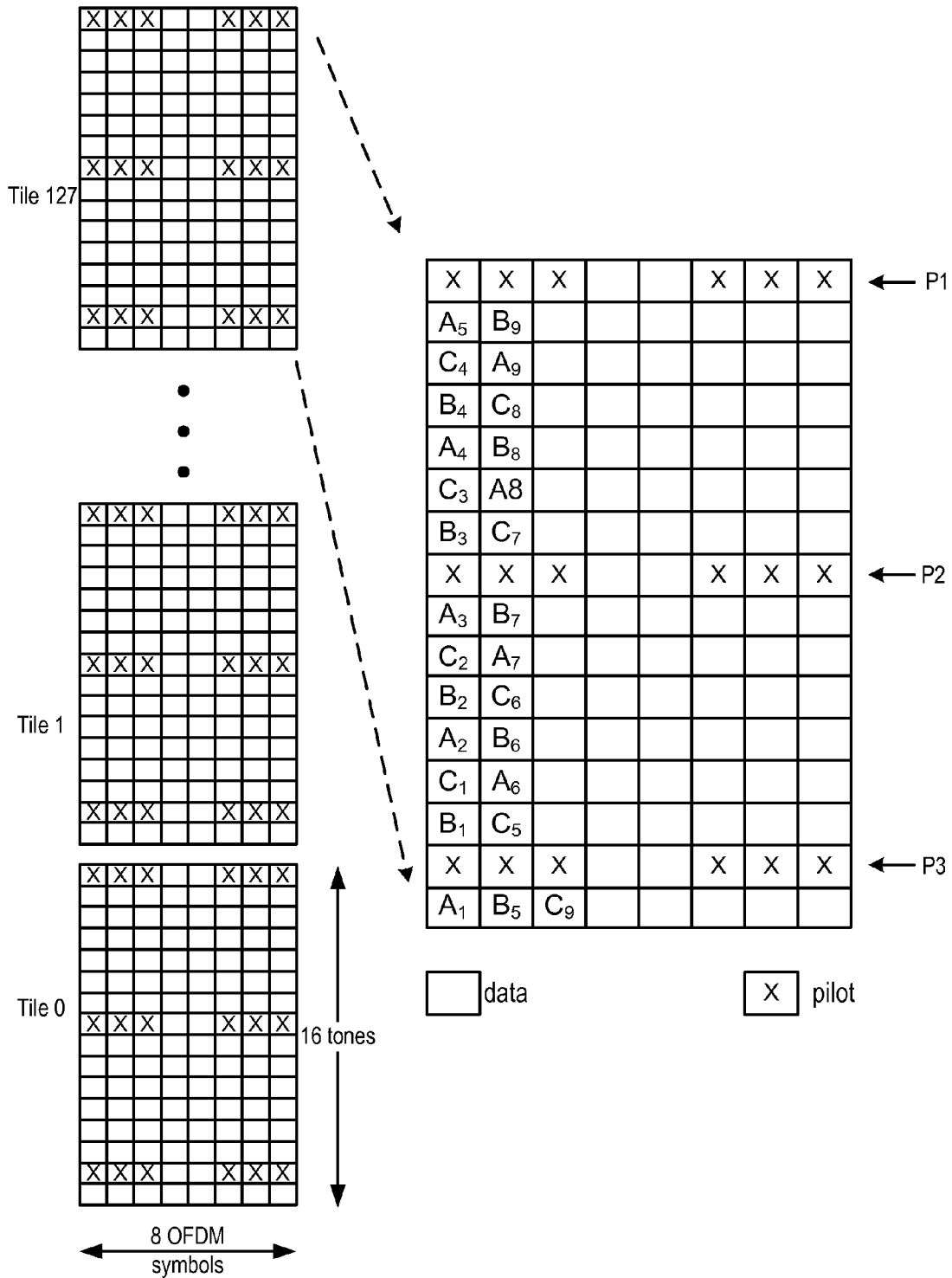
FIG. 5 depicts a logical arrangement of OFDM data.

FIG. 5 shows an example of an OFDM signal broken into 128 tiles with each tile being made from 16 separate tones (or sub-channels) over 8 OFDM symbols such that each tile may consist of as many as 128 symbols. The format of FIG. 5 shows an OFDM physical layer that provides a 3-D time-frequency-space grid that may be used according to a Block Hopping Mode where some of these tiles may are assigned to an AT.

As shown in FIG. 5, each of the various tiles can have both data symbols (designated by the indexed A, B, C's) and pilot symbols (designated by the X's), with data symbols being used to carry information and pilot symbols being used to perform a wide variety of tasks, some of which may be explained further below noting that an orthogonal pilot sequence from an AP Tx antenna can allow channel and interference estimation per layer.

Again, non-pilot symbols can be occupied by Data from several subpackets where symbols from a subset of subpackets are "painted" on non-pilot tones in a round-robin fashion across one or more tiles.

Depending on a desired assignment of tiles to data, payload data may be effectively arranged. For example, in FIG. 5 tile 127 is shown as having been assigned to hold three sub-packets of information {A, B, C} with sub-packet {A} containing data symbols $(A_0, A_1, A_2, A_3, \ldots)$, sub-packet {B} containing data symbols $(B_0, B_1, B_2, B_3, \ldots)$, and sub-packet {C} containing data symbols $(C_0, C_1, C_2, C_3, \ldots)$. Note that the various symbols are interspersed together in a process/format that may be referred to as "painting." Painting patterns allow for pipelining of Demod and Decode operations for different sub-packets.

Figure 6:
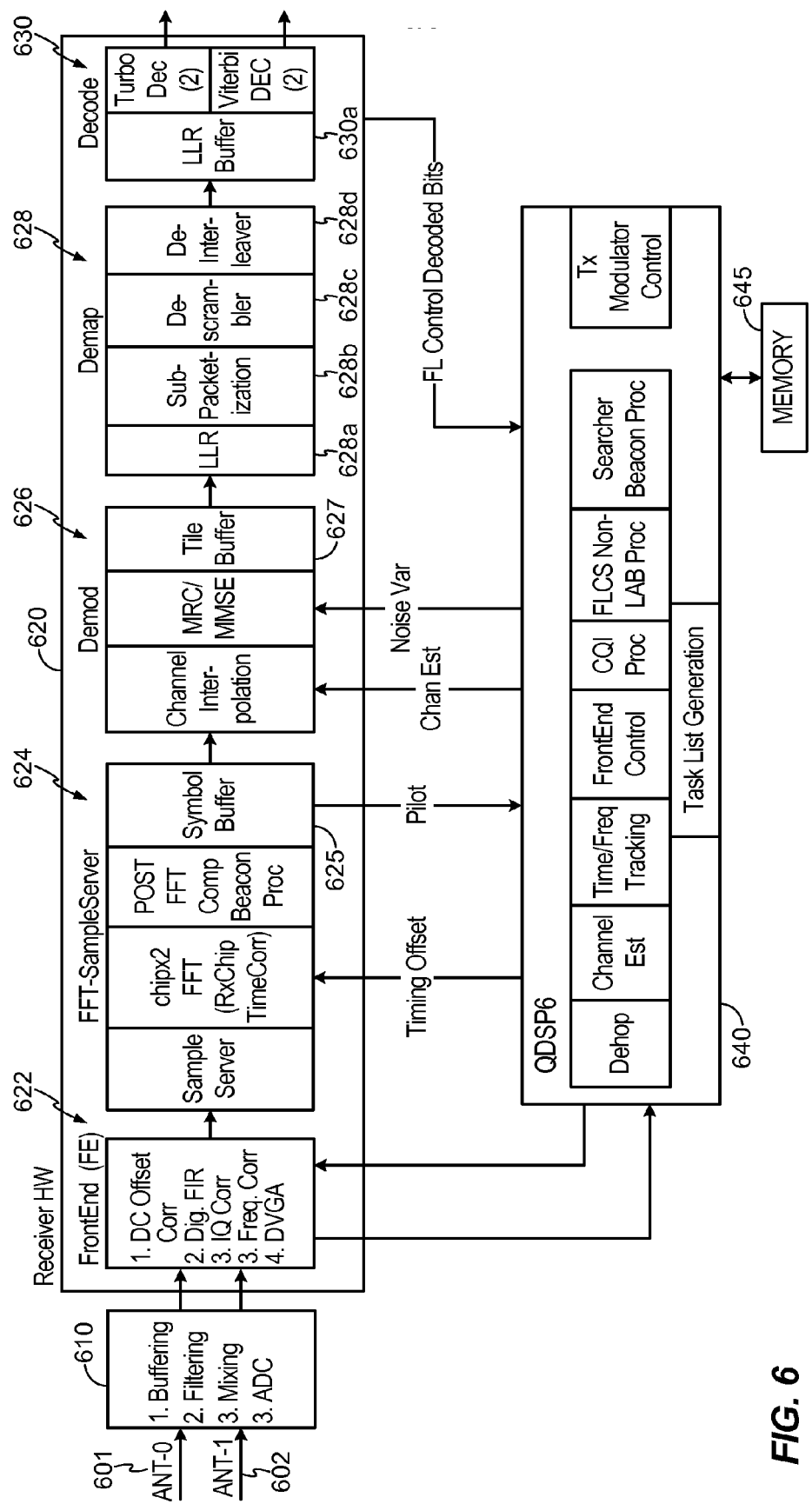
FIG. 6 depicts an exemplary hardware receiver architecture with supporting processor.

FIG. 6 depicts an exemplary hardware receiver architecture with supporting processor. As shown in FIG. 6, two antennas ANT-0 601 and ANT-1 602 are shown leading to an analog front-end 610, which may perform various processes on the received signals, such as buffering, filtering, mixing and analog to digital conversion to provide two streams of digitized data to a digital front-end 622 of the receiver hardware 620 architecture. Note that each antenna 601, 602 may receive multiple signals from multiple ATs with each AT having one or more antennas and being able to transmit multiple data channels. Accordingly, the analog front-end 610 and receiver hardware 620 can be designed to provide for any and all such received channels.

Once received, processed and digitized, the digitized data may be processed according to a number of desirable processes, such as DC offset correction, digital filtering, I/Q correction, frequency correction, digital gain control, and so forth in digital front-end 622. The digital front-end 622 may then provide the digitally processed data as two or more data streams to the FFT sample server/engine 624.

The FFT sample server 624 can be designed to buffer data received from the digital front-end 622, then perform concurrent FFT operations on at least two separate streams noting that each stream can be processed independently from one another to the degree that FFT sizes can be independent and post-FFT processing can also be handled independently such that time offsets and filter distortion may be independently handled. For example, if two concurrent data streams are received with the first stream received with a 1 micro-second offset and the second received with a 5 micro-second offset, then post-FFT processing may be provided such that each offset is correctly accounted/corrected. Note that the FFF sample server 624, like the rest of the various modules in the receiver hardware 620, may be dynamically configured under control of a processor designated here as a Model QDSP6 640, which may be any form of sequential instruction processing machine executing software/firmware, having either on board or off board memory (not shown). Therefore, other processors than the QDSP6 640 may be used according to design preference. Coupled to the processor 640 is optional memory 645, for storing data/instructions, and so forth. In some processors, the memory 645 may be contained on the processor, rather than off the processor.

Continuing, post-FFT corrected data may then be stored in an FFT symbol buffer 625, which may then be provided to the Demod engine 626, which may perform any number of demodulation operations, such as MMSE or MRC operations, to produce dual demodulated outputs (independent from one another) with each output arranged logically in a manner consistent with the tiles of FIG. 5. Note that each entry of each tile may include three components including a real portion (I), a complex portion (Q) and a related SNR. Demodulated data may then be stored in the Tile Buffer 627, and may be further processed by Demap Engine 628 and Decode Engine 630 in manners more fully discussed below.

The exemplary Demap Engine 628 may be divided into four functional components, including a log-likelihood ratio (LLR) Engine 628a, a sub-packetization engine 628b, a descrambler 628c and a de-interleaver 628d. Again, as with the previous modules, the Demap Engine 628 can handle multiple channels concurrently.

The LLR Engine 628a can be responsible for generation log-likelihood-ratios, which may convey the soft information needed/useable by a decoder. In the present embodiment, LLRs may be generated independently for two layers in MIMO arrangements. The inputs may include demodulated I, Q, SNR data—per layer for each tone and Modulation Order. The output may include log-likelihood-ratios (LLRs) for 2-bit data in Quadrature Phase Shift Keying (QPSK), 3-bit data in Phase Shift Keying (8PSK), 4-bit data in Quadrature Amplitude Modulation (16 QAM) and/or 6-bit data (64 QAM), as well as for other available or applicable schemes.

The sub-packetization engine 628b can be responsible for converting tile-based OFDM data into data organized as sub-packets. The descrambler 628c can be responsible for descrambling the data of the sub-packets and the de-interleaver 628*d* can be responsible for sorting data to the LLR buffer 630*a* of the Decoder 630 with minimal chance of data collision. The LLR data may then be ported to the Decoders 630 shown in FIG. 6. Note that the issue of porting all the data required to the Decoders 630 of FIG. 6 in an efficient manner is not trivial.

Figure 7A:
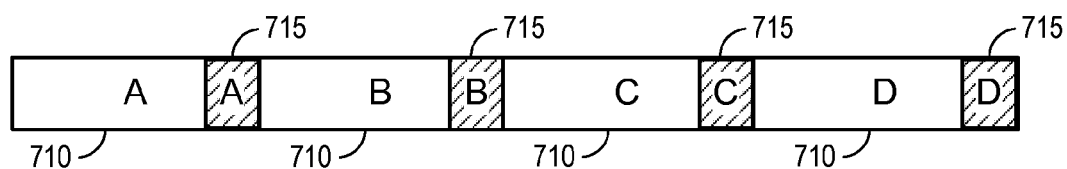
FIGS. 7A-B depict an arrangement of packets/sub-packets and their respective tile ordering.
Figure 7B:
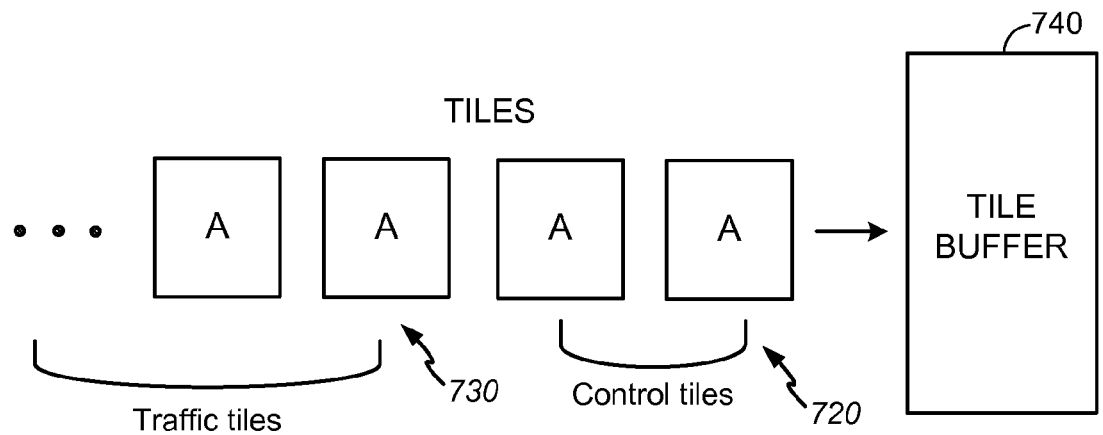

This problem can best be illustrated by FIG. 7A which generally depicts a packet in a forward link transmission as first discussed in FIG. 4. Here, data for users A, B, C and D are segregated into their sub-packets having traffic data 710 adjuncted with control data 715. Receivers, using the approach shown in FIG. 6 process the packets/sub-packets to generate a sequence of tiles for storage in the Tile Buffer 740, as shown in FIG. 7B. In FIG. 7B's example, user A's tiles are arranged with the first tile(s) 720 being control data for user A and the following tiles 730 being the traffic data for user A. Similarly, user B, C, and D's tiles will be arranged to contain leading control data tiles followed by traffic data tiles (not shown). However, control data can be efficiently decoded using a Viterbi decoder and the traffic data can be efficiently decoded using a Turbo decoder. Therefore, an increase in throughput can be obtained by having a separate Viterbi decoder primarily used for the control data and a Turbo decoder primarily used for the traffic data, that can individually operate on the respective parts of the tiles for increased efficiency. While the decoders described herein can be described as Viterbi or Turbo decoders, it should be understood that other types of decoders may be used, for example, a Low Density Parity Check (LDPC) decoder, and so forth, according to design preference.

If two Viterbi and two Turbo decoders are utilized, then the problem is to design a memory architecture to satisfy one or more of the following properties: (1) Enable 2 Demap Engines, 2 Turbo Decoders, 2 Viterbi Decoders and one DSP processor to work in parallel on the memory architecture. (2) Memory architecture should provide transparent access for DSP to the entire memory while other engines are working. (3) Each Demap engine should be able to write up to 6 LLRs and read up to 6 LLRs, per clock cycles, in parallel, with minimal collision. LLR addresses are deinterleaved according to a PBRI method. DCH/ECI packets need up to 6 concurrent LLR accesses. Control packets may have up to 2 concurrent LLR accesses. (4) For each of the 2 Turbo Decoders, each of the 2 MAP engines should be able to fetch 2 sets of (U,V0,V0',V1,V1') per clock cycle, with minimal collision in Rate ⅕ mode. Each MAP engine should be able to fetch 2 sets of (U,V0,V0'), per clock cycle, in Rate ⅓ mode. (5) Each of the 2 Viterbi Decoders should be able to fetch 2 sets of (U,V0,V1), per clock cycle, with minimum collision. (6) Rate ⅓ and ⅕ packets for each of the 8 Interlaces should be able to co-exist in the memory architecture. (7) Memory architecture should provide mechanisms to prioritize parallel accesses in case of collision. (8) Memory architecture should provide mechanisms to prevent unauthorized access of masters to segments that belong to other masters.

While the above properties generally cover the immediate concerns of downlink processing using multiple engines operating independently or in parallel, it should be understood that in some instances, various one or more above properties may be compromised or expanded upon, according to implementation design. For example, in some embodiments, less than or more than 6 concurrent read/writes (e.g., operations) may be utilized. Also, pre-fetch and pipelining of data may be implemented to increase throughput, as needed. Accordingly, variations and modifications to the "properties" provided above are understood to be within the scope of one of ordinary skill and therefore may be made without departing from the spirit of this disclosure.

As will be shown below, the features of the present approach include: (1) It satisfies above mentioned properties. (2) The homogeneous architecture enables the assignment of the 6 master interfaces to any combination of Demappers, Turbo Decoders and Viterbi Decoders. The approach involves high-level arbitration, proper banking, low-level arbitration and multiplexing of different masters.

Figure 8:
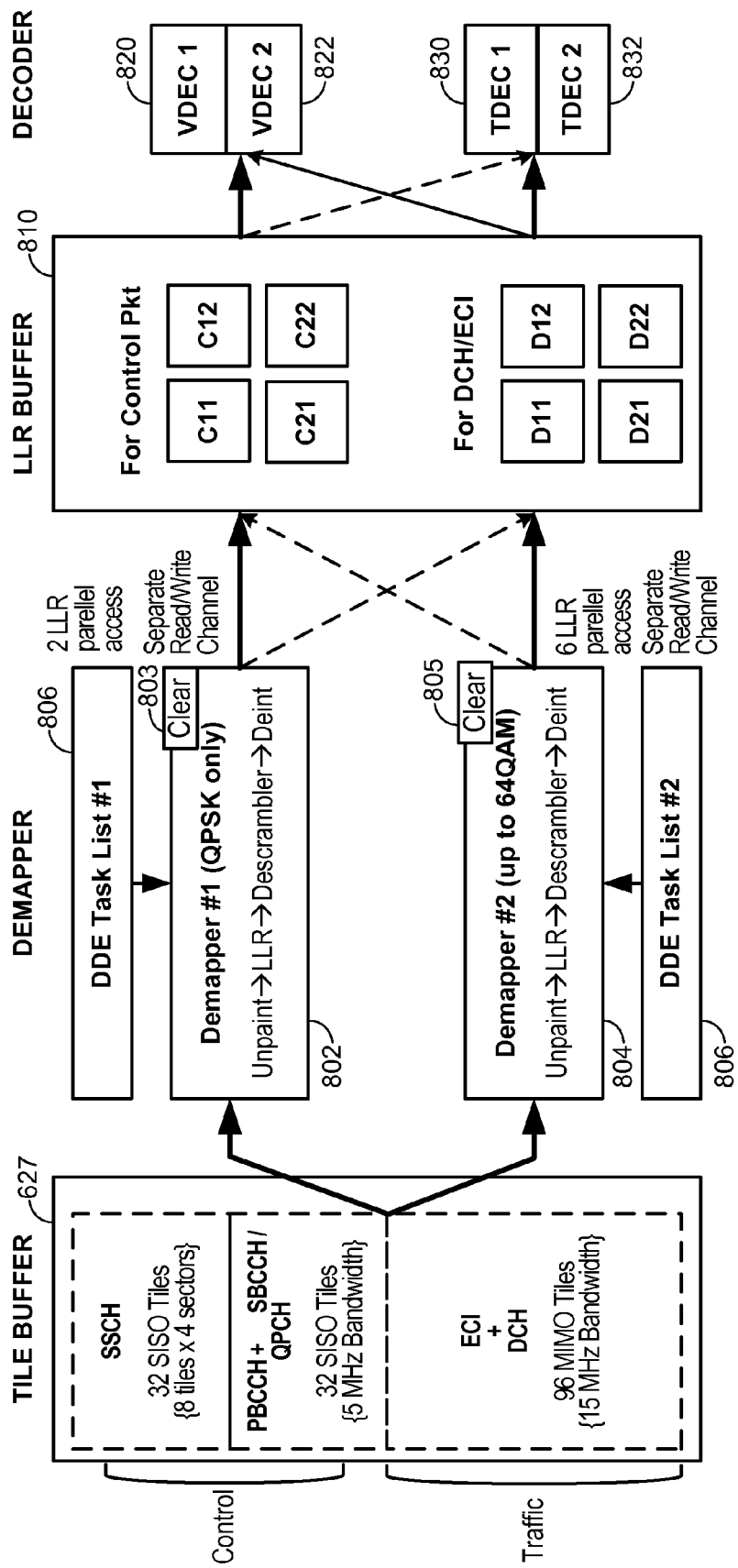
FIG. 8 depicts a portion of the exemplary hardware receiver of FIG. 6.

Referring to the LLR Buffer 810 of FIG. 8, the entire memory is logically partitioned into 8 segments of memory to service 6 masters, including the two demapping engines 802, 804 on the left and the four decoders 820, 822, 830, 832 on the right. The LLR Buffer 810 can be a multi-segmented, highly parallel, arbitrated memory, that can handle requests for different parts of its memory.

In operation, each master can gain control over one of the 8 segments through a 1st layer of arbitration, called in this disclosure the "high-level arbitration" portion.

Once a master has control of a segment, it can drive up to 6 write channels and 6 read channels in parallel to that segment. Such a master may be performing Demap, Turbo Decode or Viterbi Decode operations.

Each segment is internally broken down into a number of memory banks (for example, C11, C12, C21, C22, D11, D12, D21, D22) to support 0-collision LLR access when Demap engines 802, 804 access LLRs according to various PBRI methods. Note that 6 write channels and 6 read channels are internally arbitrated in case one or more of the masters access some portion of memory using a pattern other than PBRI.

In order to reach 0-collision while 6 channels are working in parallel, memory banking is based on certain properties of PBRI algorithm. The memory structure can also provide a same-cycle wait signal to simplify interface design for each of the masters. The high-level arbitration can prevent various masters to gain access to a memory segment currently under control of another master. Note that high-level arbitration can be programmable in lock-step mode, which can enforce the order in which masters access a memory segment. Arbitration can be controlled by the DDE Task List(s) 806, 808.

In order to avoid unnecessary read-modify-write operations, each write channel for each master can be provided with a per-LLR write control signal. This feature significantly simplifies the design.

It should be appreciated that for various telecom standards, such as UMB, not all LLRs for a given sub-packet will be received within the same transmission. Hence, before the sub-packet can be delivered to the decoders, all LLR values that have not been received for this sub-packet should be cleared to zero.

The traditional way of clearing those LLRs that are not received yet is to continue zeroing out LLRs one by one. This method is time consuming and adds to the complexity of hardware.

In contrast, the present disclosure provides a fast method of clearing all LLR values that reduces the number of HW cycles. This approach relies on the structure of LLR Buffer 810 described above whereby 6 parallel writes of one of the demapper engines 802, 804 is enabled, as well as on the overall task-based (806, 808) structure data transfer.

That is, by installing a dedicated "Clear LLR device" 803, 805 in one or both demappers 802, 804, the Clear LLR device 803, 805 can utilize all 6 available channels to the LLR Buffer 810 to zero out LLR locations in minimal time. This structure of the LLR Buffer 810 enables clearing LLRs for more than one sub-packet at a time which in turn can further shorten processing timeline.

In operation, it should be appreciated that a Clear LLR device 803, 805 may operate on a particular memory in the LLR Buffer 810 at those times when its respective Demapper 802, 804 is not accessing the memory.

As should be apparent from this disclosure, an increase in downlink throughput is made possible by portioning various tiles in the Tile Buffer 627 to different Demappers 802, 804. With multiple Demappers 802, 804 operating on the different tiles, the results from the multiple Demappers 802, 804 can be stored/written to select memory areas of the exemplary LLR Buffer 810, and further processed by the multiple Decoders 820, 822, 830, 832 by appropriate arbitration and selection of the memory areas of the LLR Buffers 810. By "decoupling" the control data from the traffic data, multiple Demappers 802, 804 and Decoders 820, 822, 830, 832 can be effectively utilized in a parallel like fashion when desired. With the downlink information processed accordingly, and utilizing multiple processing streams, a significant increase in downlink operations can be achieved.

Figure 9:
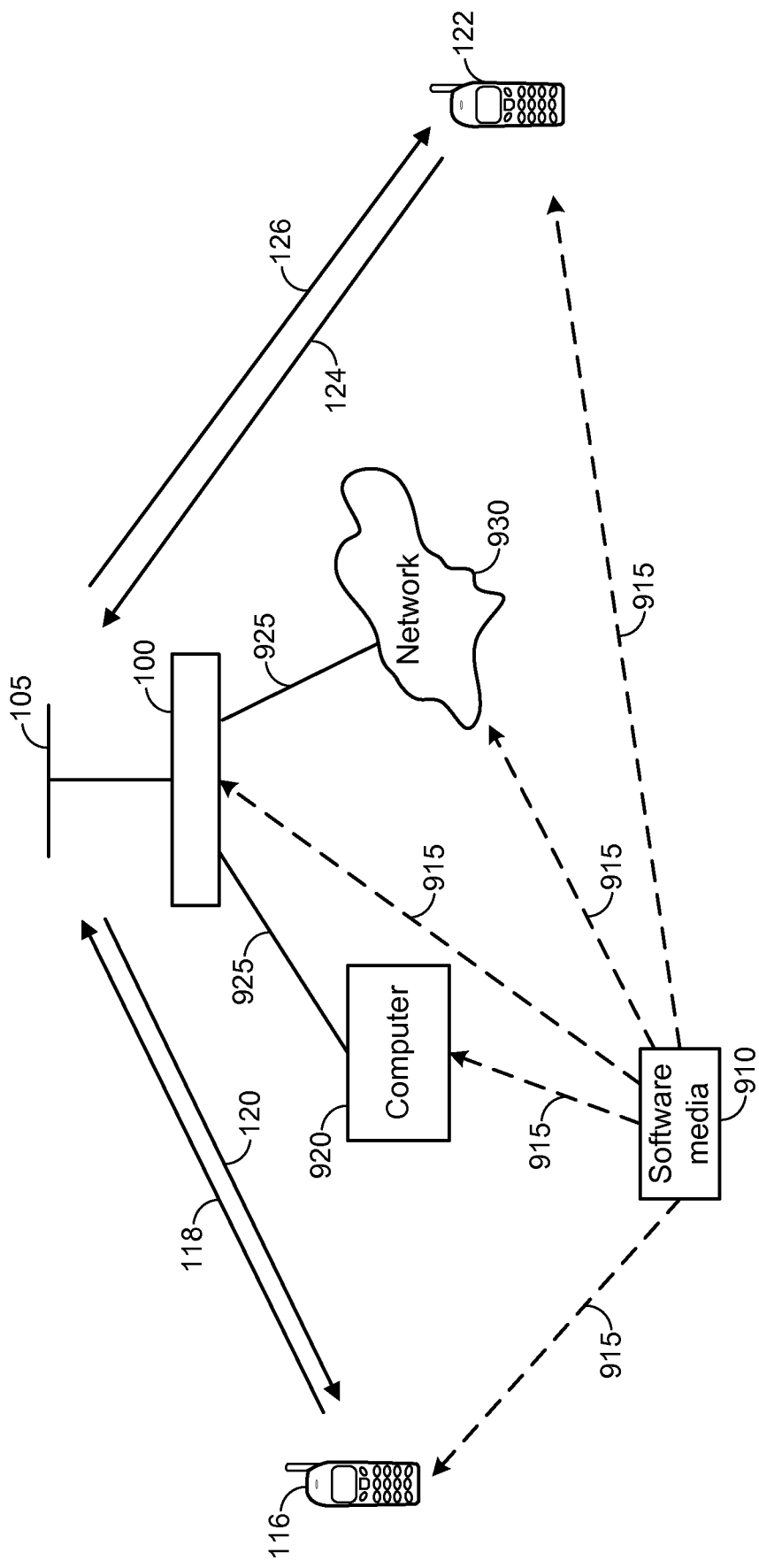
FIG. 9 depicts an exemplary system with software media.

FIG. 9 depicts one possible configuration for instructing the above-described hardware to perform the processes described, using as one example software instructions coded onto a media. FIG. 9 shows antenna(s) 105 on access point 100 which transmits and receives to access terminals 116, 122 via wireless downlinks 120, 126 and wireless uplinks 118, 124. Software 910 containing instructions for the above-described processes can be uploaded or incorporated either in part or in whole to the access point 100, access terminals 116, 122, computer 920, and/or network 930 (that is connected to the access point 100 via communication channel(s) 925) using any one of communication links 915, to arrive at the access terminals 116, 122. The software instructions can also be coded into memory resident on the access terminals 116, 122, as possibly RAM, ROM, programmable memory or any available mechanism for encoding instructions for use by a processor.

The various methods and systems described herein may be applicable to LTE, UMB, and other protocols that require demapping and decoding of a downlink signal.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. In the alternative, the processor and the storage medium may reside as discrete components in the access terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus for enhanced downlink processing of received channels in a mobile communications system, the apparatus comprising:
    a buffer containing at least demodulated control data and demodulated traffic data;
    a demapper engine containing at least two demappers independently operating on the at least control data and traffic data from the buffer;
    a log-likelihood-ratio (LLR) buffer supporting a plurality of memory segments accessible by the demapper engine;
    a decoder engine containing a plurality of decoders, each of the plurality of decoders operating on data from a selected memory segment of the LLR buffer; and
    an arbitrator providing control of at least one of the demapper engine, LLR buffer, and decoder engine,
    wherein at least one of the plurality of decoders is suited for decoding control data and at least another one of the plurality of decoders is suited for decoding traffic data.

2. The apparatus of claim 1, wherein the demodulated control data and traffic data is stored as orthogonal frequency division multiplexing (OFDM) formatted tiles in the buffer.

3. The apparatus of claim 1, wherein the demapper engine contains at least one of a LLR engine, descrambler engine, and de-interleaver engine.

4. The apparatus of claim 1, wherein at least one of the plurality of decoders is of a different type than at least another one of the plurality of decoders.

5. The apparatus of claim 4, wherein the at least one of the plurality of decoders is a Viterbi decoder.

6. The apparatus of claim 1, wherein the memory segments in the LLR buffer are designated as control segments and traffic segments.

7. The apparatus of claim 1, wherein the arbitrator contains a task list for designating control tasks of at least one of the demapper engine, LLR buffer and decoder engine.

8. The apparatus of claim 1, wherein the arbitrator provides control of an element of the at least one of the demapper engine, LLR buffer and decoder engine in a master-slave configuration.

9. The apparatus of claim 8, wherein a master controls access to segments of memory of the LLR buffer.

10. The apparatus of claim 8, wherein there are up to six different masters.

11. The apparatus of claim 8, wherein a master controls at least one of demap, turbo decode, and Viterbi decode operations.

12. The apparatus of claim 1, wherein the memory segments are written and read in parallel.

13. The apparatus of claim 1, wherein one of the at least two demappers contains a Clear LLR device which clears a designated memory in the LLR buffer using a plurality of memory-accessible channels operating in parallel.

14. The apparatus of claim 1, wherein one of the at least two demappers operates on Quadrature Phase Shift Keyed data and another of the at least two demappers operates on Quadrature Amplitude Modulated data.

15. A method for enhanced downlink processing of received channels in a mobile communications system, the method comprising:
inputting into a buffer demodulated control data and demodulated traffic data;
demapping the control data and traffic data from the buffer using at least two demappers operating independently;
loading demapped data into a log-likelihood-ratio (LLR) buffer supporting a plurality of memory segments;
decoding data in the LLR buffer using a plurality of decoders, each of the plurality of decoders operating on data from a selected memory segment of the LLR buffer; and
controlling operation of at least one of the demapping, supporting the plurality of memory segments, and decoding,
wherein at least one of the plurality of decoders is suited for decoding control data and at least another one of the plurality of decoders is suited for decoding traffic data.

16. The method of claim 15, wherein the demodulated control data and traffic data is stored as orthogonal frequency division multiplexing (OFDM) formatted tiles in the buffer.

17. The method of claim 15, wherein at least one of the plurality of decoders is of different type than at least another one of the plurality of decoders.

18. The method of claim 15, wherein the memory segments in the LLR buffer are loaded as control segments and traffic segments.

19. The method of claim 15, wherein the controlling is based on tasks presented in a task list.

20. The method of claim 15, wherein the controlling is arbitrated according to a master-slave configuration.

21. The method of claim 20, wherein a master controls access to segments of memory of the LLR buffer.

22. The method of claim 20, wherein up to six different masters are in control.

23. The method of claim 20, wherein a master controls at least one of the demapping and decoding.

24. The method of claim 15, wherein the loading is performed in parallel.

25. The method of claim 15, wherein the loading includes a Clear LLR operation which clears a designated memory in the LLR buffer using a plurality of memory-accessible channels operating in parallel.

26. The method of claim 15, wherein one of the at least two demappers operates on Quadrature Phase Shift Keyed data and another of the at least two demappers operates on Quadrature Amplitude Modulated data.

27. An apparatus for enhanced downlink processing of received channels in a mobile communications system, the apparatus comprising:
means for storing at least demodulated control data and demodulated traffic data;
a plurality of means for independently demapping control data and traffic data from the means for storing;
means for log-likelihood-ratio (LLR) storing, supporting a plurality of memory segments accessible by the plurality of means for independently demapping;
a plurality of means for decoding, operating on data from a selected memory segment of the means for LLR storing; and
means for providing control of at least one of the plurality of means for demapping, means for LLR storing, and plurality of means for decoding,
wherein at least one of the plurality of means for decoding is suited for decoding control data and at least another one of the plurality of means for decoding is suited for decoding traffic data.

28. The apparatus of claim 27, wherein the demodulated control data and traffic data is stored as orthogonal frequency division multiplexing (OFDM) formatted tiles in the means for storing.

29. The apparatus of claim 27, wherein the means for providing control contains a task list for designating control tasks of at least one of the plurality of means for demapping, means for LLR storing, and plurality of means for decoding.

30. The apparatus of claim 27, wherein one of the plurality of means for demapping contains a means for clearing a designated memory in the means for LLR storing using a plurality of memory-accessible channels operating in parallel.

31. A non-transitory computer-readable medium storing instructions that, when executed by a processor, allow the processor to perform a method comprising:
inputting into a buffer demodulated control data and demodulated traffic data;
demapping the control data and traffic data from the buffer using at least two demappers operating independently;
loading demapped data into a log-likelihood-ratio (LLR) buffer supporting a plurality of memory segments;
decoding data in the LLR buffer using a plurality of decoders, each of the plurality of decoders operating on data from a selected memory segment of the LLR buffer; and
controlling operation of at least one of the demapping, accessing the LLR buffer, and the decoding, wherein at least one of the plurality of decoders is suited for decoding control data and at least another one of the plurality of decoders is suited for decoding traffic data.

32. The non-transitory computer-readable medium of claim 31, wherein the demodulated control data and traffic data is input into the buffer as orthogonal frequency division multiplexing (OFDM) formatted tiles.

33. The non-transitory computer-readable medium of claim 31, wherein at least one of the plurality of decoders is of a different type than at least another one of the plurality of decoders.

34. The non-transitory computer-readable medium of claim 31, wherein the memory segments in the LLR buffer are loaded as control segments and traffic segments.

35. The non-transitory computer-readable medium of claim 31, wherein the controlling is based on tasks presented in a task list.

36. The non-transitory computer-readable medium of claim 31, wherein the controlling is arbitrated according to a master-slave configuration.

37. The non-transitory computer-readable medium of claim 36, wherein a master controls access to segments of memory of the LLR buffer.

38. The non-transitory computer-readable medium of claim 36, wherein up to six different masters are in control.

39. The non-transitory computer-readable medium of claim 36, wherein a master controls at least one of the demapping and decoding.

40. The non-transitory computer-readable medium of claim 31, wherein the loading is performed in parallel.

41. The non-transitory computer-readable medium of claim 31, wherein the loading includes a Clear LLR operation which clears a designated memory in the LLR buffer using a plurality of memory-accessible channels operating in parallel.

42. The non-transitory computer-readable medium of claim 31, wherein one of the at least two demappers operates on Quadrature Phase Shift Keyed data and another of the at least two demappers operates on Quadrature Amplitude Modulated data.

43. An apparatus for enhanced downlink processing of received channels in a mobile communications system, the apparatus comprising:
 a processor, configured to control operations for:
 inputting into a buffer demodulated control data and demodulated traffic data;
 demapping the control data and traffic data from the buffer using at least two demappers operating independently;
 loading demapped data into a log-likelihood-ratio (LLR) buffer supporting a plurality of memory segments;
 decoding data in the LLR buffer using a plurality of decoders, each of the plurality of decoders operating on data from a selected memory segment of the LLR buffer; and
 controlling operation of at least one of the demapping, accessing the LLR buffer, and decoding,
 wherein at least one of the plurality of decoders is suited for decoding control data and at least another one of the plurality of decoders is suited for decoding traffic data; and
 a memory coupled to the processor for storing data.

44. The apparatus of claim 43, wherein the demodulated control data and traffic data is stored as orthogonal frequency division multiplexing (OFDM) formatted tiles in the buffer.

45. The apparatus of claim 43, wherein the controlling is based on tasks presented in a task list.

46. The apparatus of claim 43, wherein the controlling is arbitrated according to a master-slave configuration.

47. The apparatus of claim 43, wherein the loading includes a Clear LLR operation which clears a designated memory in the LLR buffer using a plurality of memory-accessible channels operating in parallel.

* * * * *